(12) United States Patent
Aoki

(10) Patent No.: US 6,579,734 B2
(45) Date of Patent: Jun. 17, 2003

(54) WIRE BONDING METHOD

(75) Inventor: Shigenari Aoki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/910,953

(22) Filed: Jul. 24, 2001

(65) Prior Publication Data

US 2002/0146898 A1 Oct. 10, 2002

(30) Foreign Application Priority Data

Apr. 9, 2001 (JP) ........................................ 2001/109936

(51) Int. Cl.⁷ ............................................. G01R 31/26
(52) U.S. Cl. ............................. 438/15; 438/14; 438/17; 438/612; 438/617; 257/779
(58) Field of Search .............................. 438/14, 15, 17, 438/106, 612, 617; 257/779

(56) References Cited

U.S. PATENT DOCUMENTS

| 5,517,127 | A | * | 5/1996 | Bergeron et al. |
| 5,981,370 | A | * | 11/1999 | Rincon et al. |
| 6,166,556 | A | * | 12/2000 | Wang et al. |
| 6,251,694 | B1 | * | 6/2001 | Liu et al. |
| 6,297,561 | B1 | * | 10/2001 | Liu et al. |
| 2002/0016070 | A1 | * | 2/2002 | Friese |

* cited by examiner

Primary Examiner—Long Pham
(74) Attorney, Agent, or Firm—Rabin & Berdo, PC

(57) ABSTRACT

A semiconductor device is provided which is obtained by wire bonding without any drop in wire bonding characteristics. A bonding pad is prepared on which a wire bonding region and a test region that is separate from the wire bonding region are defined. A characteristic test is performed on the semiconductor element in the test region. Wire bonding in which a wire is connected is performed in the wire bonding region.

7 Claims, 6 Drawing Sheets

WIRE BONDING METHOD

BACKGROUND OF THE INVENTION

1. Field of the Invention

The present invention relates to a bonding pad (electrode) which is one part of an integrated circuit.

2. Description of Related Art

Technology that is related to the present invention will be briefly described with reference to FIGS. 6(A) through 6(D). Following the completion of the wafer process and prior to wire bonding, a probe test (also called a wafer test) is performed in order to ascertain the acceptability of the product as a semiconductor element. In this probe test, as is shown in FIG. 6(A), a probe needle 24 is caused to contact a bonding pad (electrode) 12 on the surface of he semiconductor wafer, and electrical characteristics are tested. For example, as is shown in FIG. 6(A), this bonding pad 12 is formed on the surface of an inter-layer insulating film 10 such as a silicon oxide film with a TiN film 16 and Ti film 14 interposed, and the region that is to be wire-bonded on the pad surface is demarcated by a Ti film 18, a TiN film 20 and a passivation film 22, etc.

In cases where the semiconductor element is judged to be defective on the basis of the results of this probe test, treatments such as trimming of the internal voltage corresponding to the semiconductor chip or redundant replacement of the faulty bits, etc., are performed prior to wires bonding.

These treatments are accomplished by utilizing a laser beam, etc., to blow away (evaporate) desired fuses among the fuses installed inside the semiconductor chip, together with the passivation films formed on these fuses, so that these fuses are cut.

Furthermore, in the case of LSI circuits with multi-layer wiring (or interconnection), the fuses are installed in a metal layer which is formed on top of the uppermost polysilicon layer among several polysilicon layers. Moreover, the fuses installed in this metal layer will be referred to below as "metal fuses". Metal layers equipped with such metal fuses ordinarily consist of aluminum (Al).

Accordingly, in the case of semiconductor wafers equipped with such metal fuses, a protective film 28 such as a passivation film (insulating film), etc., is again formed over the entire surface of the wafer as shown in FIG. 6(B) following the cutting of the metal fuses, so that contact between the cut surfaces of the fuses and the water content that is absorbed in the package is avoided, thus preventing corrosion of the Al layer.

Since this protective film is formed, the bonding pad 12 that has been probe-tested is covered by this protective film 28 as shown in FIG. 6(C). Accordingly, the bonding pad 12 is exposed by etching the protective film 28.

However, the bonding pad is damaged by needle tracks, etc., as a result of contact with the probe needle during the probe test (indicated by 26 in FIGS. 6(A) and 6(B). Since the damaged region of the bonding pad is etched when the protective film is re-etched, a hole 31 which exposes the underlying layer 14 is formed in this damaged region, or a deep recess is formed.

Conventionally, the regions where the probe test and wire bonding are performed on the abovementioned bonding pad are substantially the same region.

Accordingly, the contact area between the bonding pad 12 and the wire 32 is reduced, so that favorable wire bonding cannot be obtained. Furthermore, wire bonding becomes difficult.

SUMMARY OF THE INVENTION

A first object of the present invention is to provide a bonding pad with a structure that allows favorable bonding of a wire to an undamaged region of the bonding pad even if the bonding pad is damaged by a probe test.

A second object of the present invention is to provide a semiconductor device which is equipped with the above-mentioned bonding pad.

A third object of the present invention is to provide a method for performing wire bonding on the above-mentioned bonding pad.

The semiconductor element bonding pad of the present invention has a wire bonding region and a test region which is separated from the wire bonding region.

As a result of such a bonding pad structure, the bonding pad can be set with a wire bonding region that is required for joining with the wire in the case of wire bonding, and a test region required for characteristic tests, etc., performed on the semiconductor element, and both of these regions can be set as respectively different regions.

Accordingly, in the case of wire bonding, the wire can be joined to the wire bonding region so that joining of the wire to the damaged test region on the bonding pad can be avoided. Consequently, wire bonding can be performed easily and reliably.

As a result, a semiconductor device with good wire bonding characteristics can be obtained.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1A:
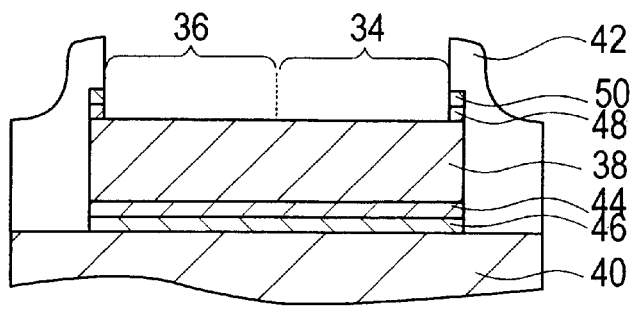
FIG. 1 (including FIG. 1(A) to FIG. 1(C)) is a process diagram which is used to illustrate the wire bonding method in a semiconductor device constituting a first embodiment of the present invention.

With reference to the drawings, a detailed description will hereinafter be given to preferred embodiments of the present invention. Furthermore, FIGS. 1 through 4 are process diagrams which are used to explain examples of the semiconductor device (including the bonding pad) and the wire bonding method of the present invention. The respective diagrams are sectional views. Furthermore, the hatching, etc., that expresses sections of the respective constituent elements indicates that portions are omitted. Moreover, the respective drawings indicate the dimensions, shapes and positional relationships of the respective constituent elements schematically, to an extent that allows understanding of the present invention. Furthermore, specified materials and conditions, etc., may be used in the following description; however, these materials and conditions, etc., are merely appropriate examples, and the present invention is not limited to these examples.

<First Embodiment>

The semiconductor of the present invention is equipped with a bonding pad that is formed on the upper surface of a semiconductor element, and a wire.

Accordingly, the wire bonding method which is used to bond the bonding pad and wire in the semiconductor device of the present invention will be described below with reference to FIGS. 1(A) through 1(C) and FIGS. 2(A) and 2(B).

First, as a first process, a bonding pad 38 is prepared on which a wire bonding region 34 and a test region 36 that is separate from the wire bonding region 34 are set.

Accordingly, a bonding pad 38 consisting of aluminum (Al) is formed on the upper surface of the inter-layer insulating film of the semiconductor wafer, e.g., a silicon oxide film ($SiO_2$) 40. In this case, the bonding pad 38 of the present invention is preferably formed as an island-form layer. A wire bonding region 34 which is required for bonding with the wire in wire bonding, and a test region 36 which is required for testing of the electrical characteristics, etc., of the semiconductor element, are set on the exposed surface region of this same bonding pad 38. The two regions 34 and 36 are separate regions that do not overlap each other. In this desirable example of construction, the two regions are defined as regions that are adjacent to each other.

Furthermore, in the formation of the bonding pad 38, as is shown in FIG. 1 (A), the exposed surface of the bonding pad 38 is formed by etching the portion of the passivation film 42 (which is formed over the entire surface of the silicon oxide film 40 of the semiconductor wafer, including the bonding pad 38) that is located above the bonding pad 38 by means of any suitable etching method (not shown in the figures). Furthermore, the passivation fi m, for example, can be an SiN film.

Accordingly, in the present embodiment, the passivation film 42 above the probe test region 36 (which constitutes the test region) and the wire bonding region 34 is removed by etching (FIG. 1(A)).

Furthermore, in the desirable example of construction shown in FIG. 1(A), the Ti film 44 and TiN film 46 are barrier metal layers that are located between the bonding pad 38 and the silicon oxide film 40, and the Ti film 48 and TiN film 50 formed on the upper part of the bonding pad 38 are barrier metal layers that are located between the bonding pad 38 and the passivation film 42.

Afterward, as a second process, a probe test which is a test of the characteristics of the semiconductor element is performed in the probe test region 36.

In this case, a probe needle 52 is caused to contact the surface of the probe test region 36 of the bonding pad 38, which consists of aluminum.

Figure 1B:
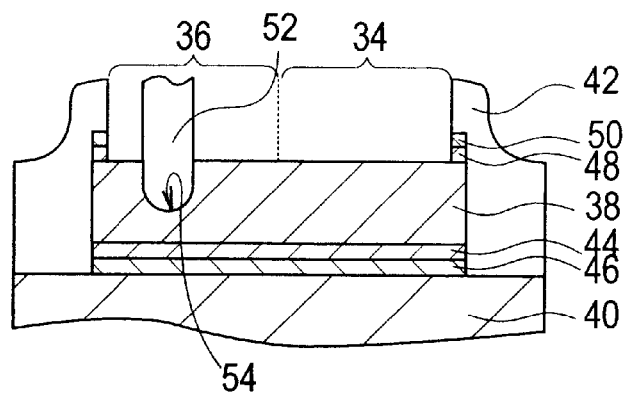

As a result of the contact of the probe needle 52 with the aluminum bonding pad 38 from the side of the exposed surface of this bonding pad 38, damage 54 is formed in the bonding pad that extends downward from the surface of the test region 36 (FIG. 1(B)).

Figure 1C:
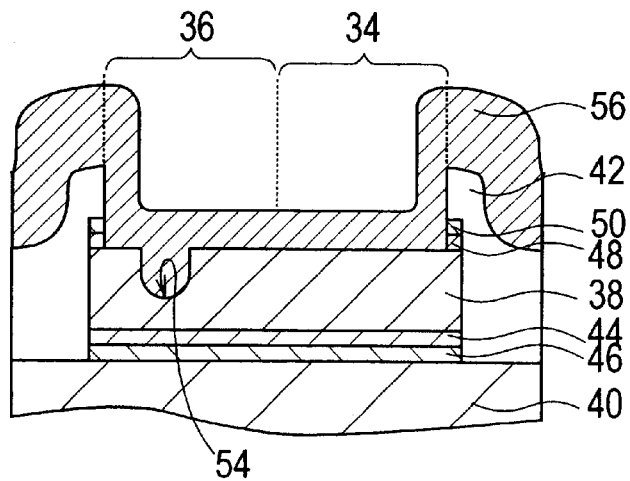

Then, after treatments such as fuse cutting, etc., have been performed on the basis of the results of the probe test, a new passivation film 56 which is used to protect the cut portions (surfaces) of the fuses (not shown in the drawings) is formed over the entire surface of the passivation film 42 formed on the semiconductor wafer (FIG. 1(C)).

Then, the bonding pad 38 is reopened using any suitable etching method. Specifically, etching is performed in order to expose the surface of the bonding pad 38.

Accordingly, in the present embodiment, the passivation film 56 formed on top of the probe test region 36 and wire bonding region 34 is removed by etching.

In this case, the bonding pad 38 itself is also etched along with the passivation film 56 that is formed on top of the bonding pad 38. As a result of this etching, the portion of the bonding pad region located beneath the damage 54 is also etched, so that a hole 59 which reaches a portion of the surface of the Ti film 44 that constitutes the underlayer film is formed. The exposed portion of this underlayer 44 is designated as the exposed portion 58 (FIG. 2(A)).

However, the wire bonding region 34 of the bonding pad 38 is substantially free of this damage caused by etching; furthermore, the damage to which the test region 36 is subjected does not extend to the wire bonding region 34. Accordingly, the surface of this region 34 remains as a flat surface free of indentations or projections or hole, which is suitable for bonding.

Figure 2A:
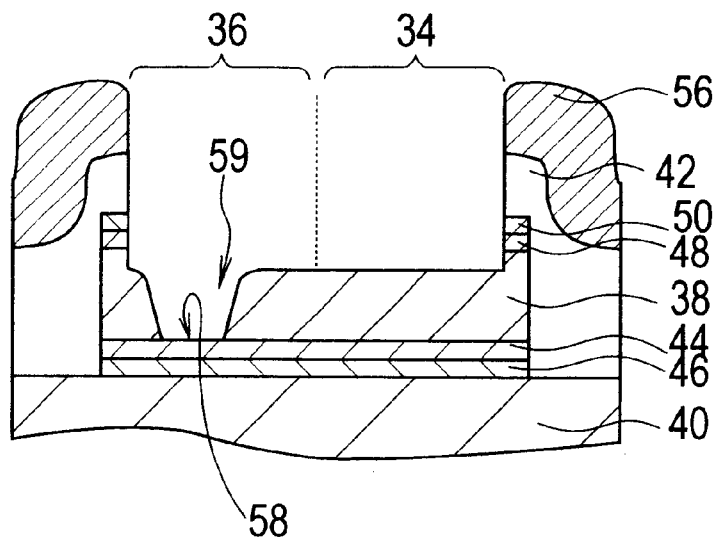
FIG. 2 (including FIG. 2(A) and FIG. 2(B)) is a process diagram that is a continuation of FIG. 1.
Figure 2B:
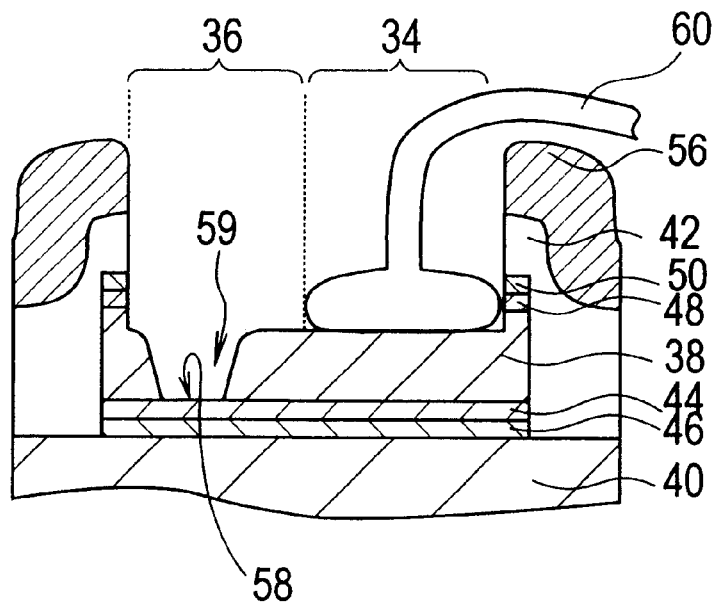

Next, as a third process, wire bonding is performed by connecting a wire 60 with superior conductivity, which preferably consists of a metal such as gold, etc., to the wire bonding region 34 of the bonding pad 38 (FIG. 2(B)).

Afterward, a semiconductor device is obtained by performing specified treatments for device assembly.

In the abovementioned embodiment of the present invention, the bonding pad 38 has a size which allows the setting of the wire bonding region 34 and a test region 36 that is independent of this wire bonding region 34. It is advisable to set the size of the test region 36 so that in cases where the test region 36 is damaged, the effects of this damage do not reach the wire bonding region 34, or to set the size of the wire bonding region 34 so that even if the effects of the abovementioned damage do reach the wire bonding region 34, the wire 60 can be bonded to a portion of the region that is not reached by the effects of the damage.

Accordingly, in the case of this bonding pad and semiconductor device, the reliability of wire bonding is conspicuously improved over that seen in conventional devices.

Furthermore, in this wire bonding, since the wire 60 is bonded to a pad region that is free of damage, wire bonding can be performed with greater certainty.

<Second Embodiment>

In a second embodiment of the present invention, a process that is the same as the first process of the first embodiment is first performed.

Accordingly, in this embodiment, only the test region 36 is opened (i.e., exposed) during the opening of the bonding pad in the first process, so that a first protective film consisting of the passivation film 42 is formed on top of the wire bonding region 34. The process by which this first protective film is formed will be described below.

In a case where this first protective film is formed in the first process, only those portions of the passivation film 42, TiN film 50 and Ti film 48 (formed on the bonding pad 38) that are located above the probe test region 36 are removed by etching.

Figure 3A:
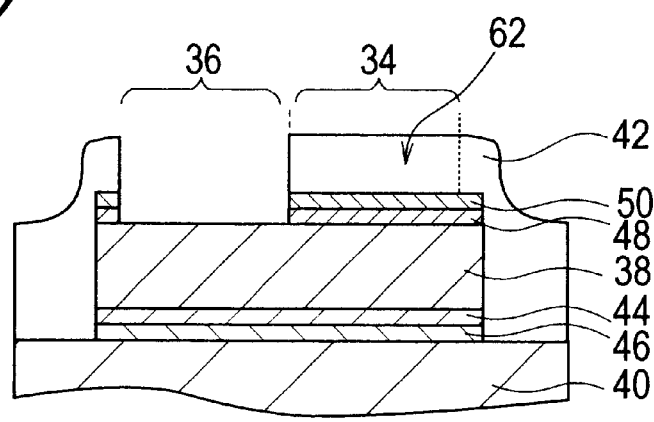
FIG. 3 (including FIG. 3(A) to FIG. 3(C)) is a process diagram which is used to illustrate the wire bonding method in a semiconductor device constituting a second embodiment of the present invention.

In this case, the portion of the passivation film 42 that remains on the wire bonding region 34 is used as a first protective film 62 (FIG. 3(A).

Furthermore, the Ti film 44 and TiN film 46 are barrier metal layers between the bonding pad 38 and silicon oxide film 40, and the Ti film 48 and TiN film 50 formed on the upper part of the bonding pad 38 are barrier metal layers between the bonding pad 38 and passivation film 42.

Afterward, a second process is performed in the same manner as in the first embodiment.

Figure 3B:
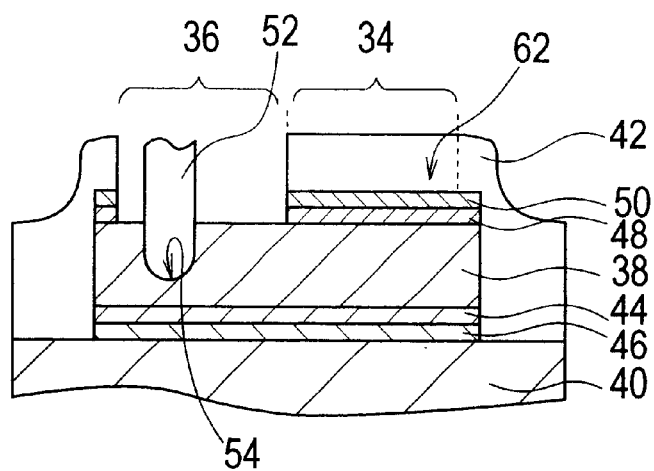
Figure 3C:
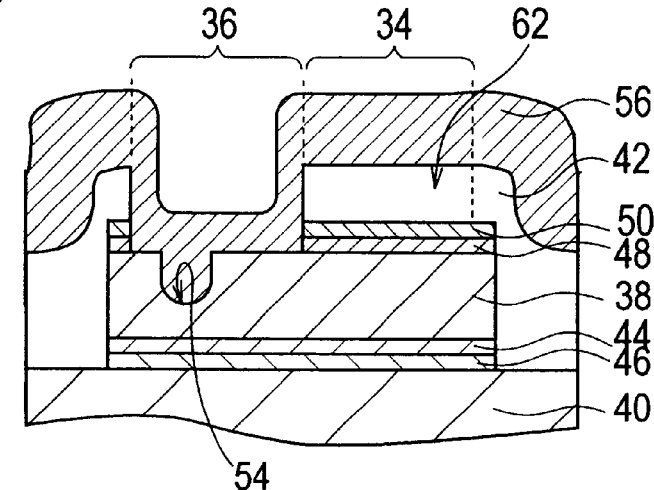

In this case, damage 54 caused by the contact of the probe needle 52 is formed in the bonding pad 38 (consisting of aluminum) in the same manner as in the first embodiment (FIG. 3(B)).

Then, after treatments such as fuse cutting, etc. (not shown in the drawings) have been performed on the basis of the results of the probe test, a new passivation film 56 which is used to protect the cut portions (surfaces) of the fuses (not shown in the drawings) is formed over the entire surface of the passivation film 42 formed on the semiconductor wafer (FIG. 3(C)).

Naturally, this passivation film 56 covers both the test region 36 and the second protective film 62.

Afterward, etching is performed by means of any suitable etching method in order to reopen (expose) the bonding pad 38.

In this case, in the present embodiment, a process in which the first protective film 62 is removed, and a process in which a second protective film 64 is newly formed on the upper surface of the probe test region 36, are performed between the second process and the third process. Accordingly, these processes will be described below.

Specifically, following the second process and prior to the third process, the respective portions of the passivation film 56, first protective film 62, TiN film 50 and Ti film 48 that are located on top of the wire bonding region 34 are removed by any suitable etching method; furthermore, the passivation film 56 located on the probe test region 36 is not removed, but is rather allowed to remain.

Figure 4A:
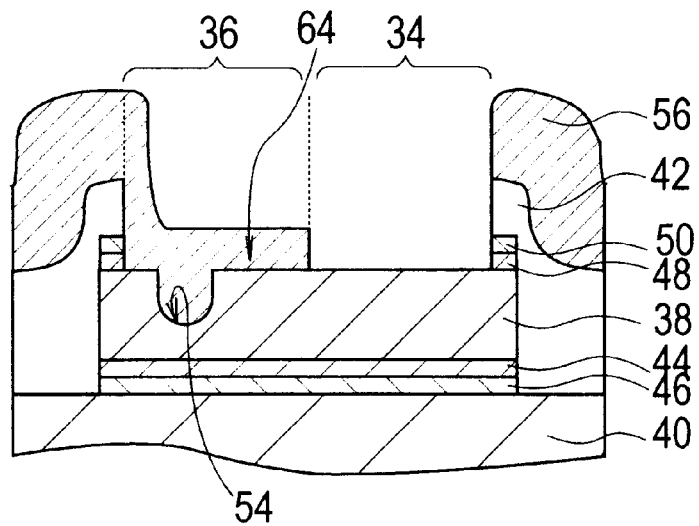
FIG. 4 (including FIG. 4(A) and FIG. 4(B)) is a process diagram that is a continuation of FIG. 3.

In this case, the passivation film 56 that remains on the probe test region 36 of the bonding pad 38 is used as the second protective film 64 (FIG. 4(A)).

Figure 4B:
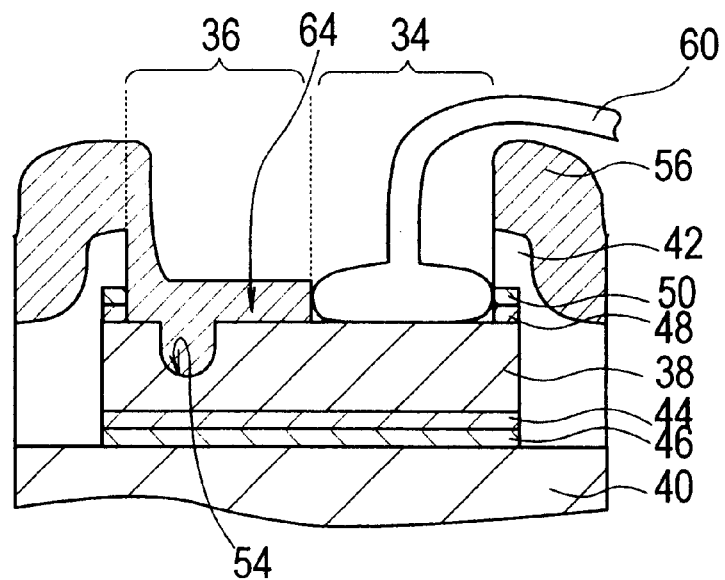

Afterward, the third process is performed in the same manner as in the first embodiment, and wire bonding is performed by connecting a wire 60 to the wire bonding region 34 of the bonding pad 38 (FIG. 4(B)).

The bonding pad 38 of the abovementioned second embodiment has properties similar to those of the bonding pad described in the first embodiment; accordingly, the bonding pad itself and the semiconductor device equipped with this bonding pad make easy and reliable wire bonding possible.

Furthermore, in the present embodiment, a first protective film 62 is formed on the wire bonding region 34 when a probe test is performed in the second process. As a result of this first protective film 62, trouble in subsequent processes caused by the erroneous contact of the probe needle 52 with the wire bonding region 34 can be avoided beforehand.

Furthermore, in the present embodiment, since protection against damage 54 caused by the probe test can be afforded by the second protective film 64, there is no danger of the invasion of moisture from this damage 54; accordingly, a drop in the moisture resistance caused by the invasion of moisture from the damage 54 can be prevented.

In the abovementioned second embodiment, a first protective film is formed as a first process. However, this first protective film may also be formed following the first process and prior to the second process.

Figure 5:
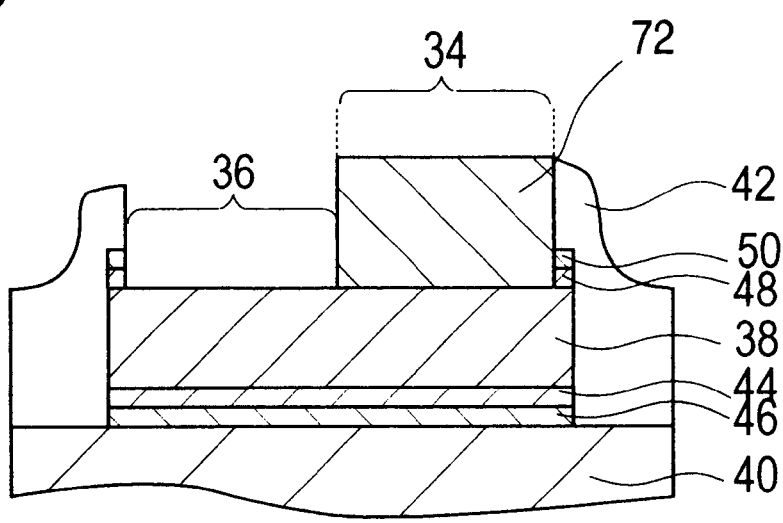
FIG. 5 is a sectional view which is used to illustrate a modification of the second embodiment of the present invention.
Figure 6A:
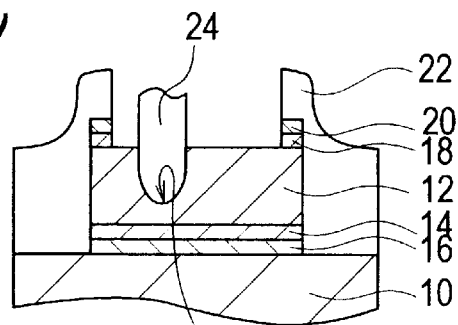
FIG. 6 (including FIG. 6(A) to FIG. 6(D)) is a process diagram which is used to illustrate a wire bonding method used in a conventional semiconductor device.
Figure 6B:
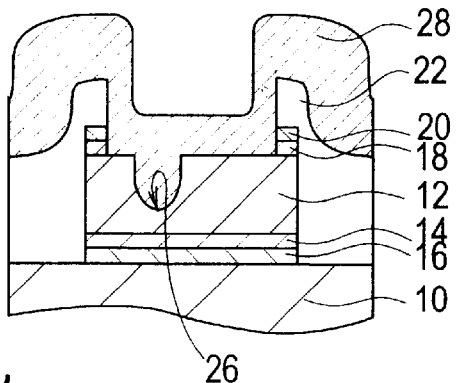
Figure 6C:
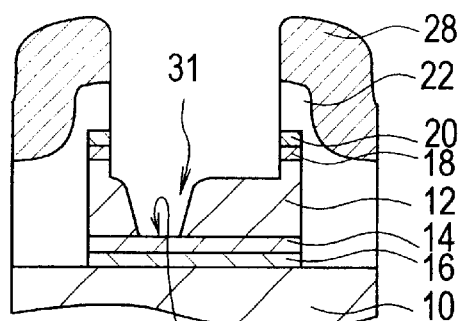
Figure 6D:
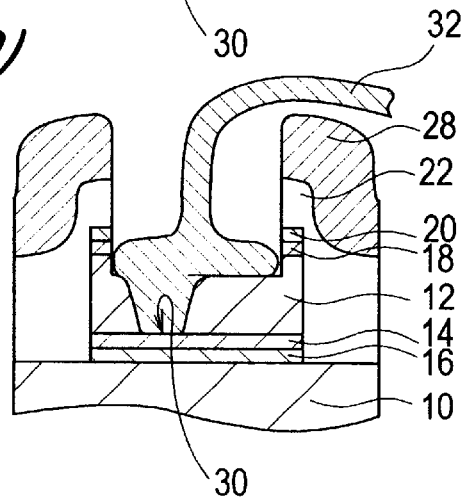

Specifically, as is shown in FIG. 5, a first protective film 72 consisting of an SiN film or some other suitable material is formed by any suitable method on the wire bonding region 34 of the bonding pad 38 whose surface is exposed. Afterward, as was described above with reference to FIG. 3(C), a passivation film 56 is formed. Subsequently, this protective film 72 is removed so that the structure shown in FIG. 4 (A) is obtained. Like the protective film 62, this protective film 72 acts to protect the wire bonding region during testing.

Furthermore, for example, the wire bonding region 34 and the test region 36 that is formed separately from the wire bonding region 34 in the present invention are not limited to continuously formed regions that are adjacent to each other as in the embodiments described above; if there is a possibility that the size of the device will be large, the two regions may be formed so that the regions are separated from each other.

What is claimed is:

1. A wire bonding method for wire bonding a bonding pad and wire of a semiconductor device, comprising:

providing a semiconductor device having a semiconductor element, a bonding pad formed on the semiconductor element, and a wire;

preparing the bonding ad by defining thereon a wire bonding region and a test region, the test region being separate from the wire bonding region;

forming a first protective film over an upper surface of the bonding pad, so that the first protective film is over both the test region and the wire bonding region;

removing the first protective film from over the test region while retaining the first protective film over the wire bonding region;

while the first protective film is disposed over the wire bonding region, performing, in the test region of the bonding pad, a characteristic test on the semiconductor element;

forming a second protective film over an upper surface of the test region; removing the first protective film from over the wire bonding region; and connecting the wire to the wire bonding region.

2. The wire bonding method according to claim 1, wherein the characteristic test is a test of electrical characteristics, and the test is performed by causing a probe needle to contact the test region.

3. The wire bonding method according to claim 1, wherein the wire bonding region and the test region are formed immediately adjacent to each other.

4. The wire bonding method according to claim 1, wherein said forming a second protective film over an upper surface of the test region also forms the second protective film over the first protective film disposed over the wire bonding region.

5. The wire bonding method according to claim 4, wherein said removing the first protective film from over the wire bonding region also removes the second protective film from over the wire bonding region.

6. The wire bonding method according to claim 5 wherein the second protective film is retained over the upper surface of the test region after the first protective film and the second protective film are removed from over the wire bonding region.

7. A wire bonding method for wire bonding a bonding pad and wire of a semiconductor device, comprising:
    providing a semiconductor device having a semiconductor element, a bonding pad formed on the semiconductor element, and a wire;
    preparing the bonding pad by defining thereon a wire bonding region and a test region, the test region being separate from the wire bonding region;
    forming a first protective film over an upper surface of the wire bonding region;
    while the first protective film is disposed over the wire bonding region, performing, in the test region the bonding pad, a characteristic test on the semiconductor element;
    forming a second protective film over an upper surface of the test region;
    removing the first protective film from over the wire bonding region; and
    connecting the wire to the wire bonding region.

* * * * *